(12) United States Patent
Sameshima

(10) Patent No.: US 6,507,478 B1
(45) Date of Patent: Jan. 14, 2003

(54) DEVICE HAVING A CRYSTALLINE THIN FILM OF COMPLEX COMPOUND

(75) Inventor: Katsumi Sameshima, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 1679 days.

(21) Appl. No.: 08/801,761

(22) Filed: Feb. 18, 1997

Related U.S. Application Data

(63) Continuation of application No. 08/544,667, filed on Oct. 18, 1995, now abandoned, which is a continuation of application No. 08/216,475, filed on Mar. 22, 1994, now abandoned.

(30) Foreign Application Priority Data

Mar. 29, 1993 (JP) .............................................. 5-069659

(51) Int. Cl.$^7$ ................................................. H01G 4/10
(52) U.S. Cl. ....................................... 361/322; 361/313
(58) Field of Search ................................ 361/303, 304, 361/305, 311, 312, 313, 321.1, 321.4, 321.5, 322; 257/295, 310; 365/145

(56) References Cited

U.S. PATENT DOCUMENTS 4,725,877 A * 2/1988 Brasen et al. ............... 257/751
5,053,917 A * 10/1991 Miyasaka et al. ......... 361/321.5
5,348,894 A * 9/1994 Chade et al. ............. 361/321.1

FOREIGN PATENT DOCUMENTS

| EP | 0514149 | * 11/1992 | .................. 361/311 |
| JP | 4-338619 | * 11/1992 | .................. 361/311 |

OTHER PUBLICATIONS

"A stacked capacitor with (Ba$_x$ Sr$_{1-x}$) TiO$_3$ for 256M DRAM" Koyama et al., IEEE IEDM, Dec. 1991 pp. 32.1.1–32.1.4.*

"Barrier layers for realization of high capacitance density in SrTiO$_3$ thin–film capacitor on silicon" Sakuma et al., Appl. Phys. Lett. 57 (23) Dec. 1990 pp. 2431–2433.*

* cited by examiner

*Primary Examiner*—M. Alexandra Elve
*Assistant Examiner*—Jonathan Johnson
(74) *Attorney, Agent, or Firm*—Merchant & Gould P.C.

(57) ABSTRACT

It is an object of the present invention to provide a device having a crystalline oxide layer of complex compound which can form a crystalline thin film with high orientation. The lower electrode 13 comprises tantalum layer 11, titanate layer 12 and platinum layer 6, and PZT thin film 8 is formed on the lower electrode 13. Since titanate layer 12 is formed on the lower electrode 13, crystallinity of the PZT thin film can be improved. Therefore, the "lift-off" method can be used with to no thermal treatment needed when forming the platinum layer 6.

13 Claims, 10 Drawing Sheets

DEVICE HAVING A CRYSTALLINE THIN FILM OF COMPLEX COMPOUND

This is a Continuation of application Ser. No. 08/544,667, now abandon filed Oct. 18, 1995 now abandoned which is a Continuation of application Ser. No. 08/216,475, filed Mar. 22, 1994 now abandoned.

BACKGROUND OF THE INVENTION

1. Field of the Invention

The present invention relates to a device having a crystalline thin film of oxide complex compound (hereinafter referred to as complex compound), more specifically, relates to improvement of crystallinity for the crystalline layer of complex compound.

2. Description of the Prior Art

In identifying dielectric properties spontaneous polarization based on permanent dipole moment and change in polarization when applying an electric field are referred to as ferroelectric properties. Among the ferroelectric properties, a substance with a chemical formula of $ABO_3$ with generates spontaneous polarization by displacement from an equilibrium point is especially referred to as ferroelectric properties with perovskite structure. Lead zirconate titanate (hereinafter PZT), has ferroelectric properties with perovskite structure is binary system solid solution porcelain of $PbZrO_3$—$PbTiO_3$. A ferroelectric thin film which utilizes PZT is applied to various semiconductor devices such as ferroelectric memory and ferroelectric capacitors and others.

Details of a ferroelectric capacitor 40 will be described below with reference to FIG. 1. As illustrated in FIG. 1, the following layers are formed consecutively on silicon layer 2, such as silicon oxide layer 4, lower electrode 13, PZT thin film 8 and upper electrode 10. In this configuration, the upper electrode 10 is made of platinum, and lower electrode 13 consists of titanium layer 5 and platinum layer 6.

Electric characteristics of PZT thin film 8 are illustrated in FIG. 2 as a hysteresis loop. In FIG. 2, the ordinate shows polarization P and an axis of abscissas shows electric field E. The PZT thin film 8 is polarized into almost same direction of the given electric field as symbolized by P1 in the FIG. 2, when applying a larger voltage than a coercive voltage to the lower electrode and upper electrode. Note that the coercive voltage is a voltage which has enough potential to erase remanent polarization from the ferroelectric layer. This polarization status will remain even when the coercive voltage is cut off, as symbolized by Q1 in FIG. 2.

On the other hand, in order to erase remanent polarization from the ferroelectric layer, a voltage is applied to the lower and upper electrode in an opposite direction against the voltage applied previously to the electrodes. As a result, the polarization is turned as symbolized by R1 in FIG. 2. At this time, the polarization remains as it is even if the voltage is cut off as symbolized by S1 in FIG. 2. Electric field E in FIG. 2 which extends Ec2 and—Ec2 functions as a diverging point of the polarization.

Since PZT thin film has the above described electric characteristics, PZT thin film 8 is applicable to manufacture ferroelectric nonvolatile memories and ferroelectric nonvolatile capacitors.

However, ferroelectric capacitor manufactured in the prior art has the following problems. In manufacturing a ferroelectric capacitor thermal treatment is carried out on the lower electrode 13 for improvement of both crystallinity and orientation of the PZT thin film 8, when sputtering is carried out during the process of forming the lower electrode 13.

The thermal treatment prevents utilization of the "lift-off" method for forming the lower electrode 13 in a predetermined shape, because of the nature of the "lift-off" method. The "lift-off" method is carried out under the following steps. First, photo resist covers several portions of a substrate where electrodes are not formed. A polysilicon layer is formed on the substrate and the photo resist. The polysilicon layer where formed on the photo resist is removed together with the photo resist when the photo resist is removed, so that the lower electrode remains on the substrate.

Although photo resist stands until 130° C., the temperature of the photo resist exceeds 130°C. when carrying out sputtering. Therefore, the "lift-off" method is not applicable to form the lower electrode.

To resolve this issue and improve crystallinity and orientation of PZT thin film 8, the thermal treatment is carried out to the lower electrode 13 when sputtering is carried out, and an "ion-milling" method is utilized to form the lower electrode 13 in a predetermined shape. A result of utilizing the "ion-milling" method is damage to the surface of the substrate due to a low selective ratio.

In other words, it is not possible for the ferroelectric capacitor formed by previous methods to realize the improvements of both crystallinity an orientation of a PZT thin film 8 without damaging the surface of the substrate.

SUMMARY OF THE INVENTION

It is an object of the present invention to provide a device having a crystalline oxide layer of a complex compound which can form a crystalline thin film with a high orientation without damaging the surface of the substrate, thereby solving the above mentioned problems.

The present invention is a device having a crystalline thin film of complex compound comprises:

a) a first electrode having a lower layer of tantalum and an upper layer which contains platinum located on the lower layer;

b) a crystalline thin film of complex compound located on the upper layer; and c) a second electrode located on the crystalline thin film.

While the novel features of the invention are set forth in a general fashion, both as to organization and content, the invention will be better understood and appreciated, along with other objects and features thereof, from the following detailed description taken in conjunction with the drawings.

BRIEF DESCRIPTION OF THE DRAWINGS

FIG. 7 is a perspective view illustrating an infrared sensor utilizing a device having a crystalline thin film of complex compound formed by the present invention.

DESCRIPTION OF THE PREFERRED EMBODIMENT

Figure 3:
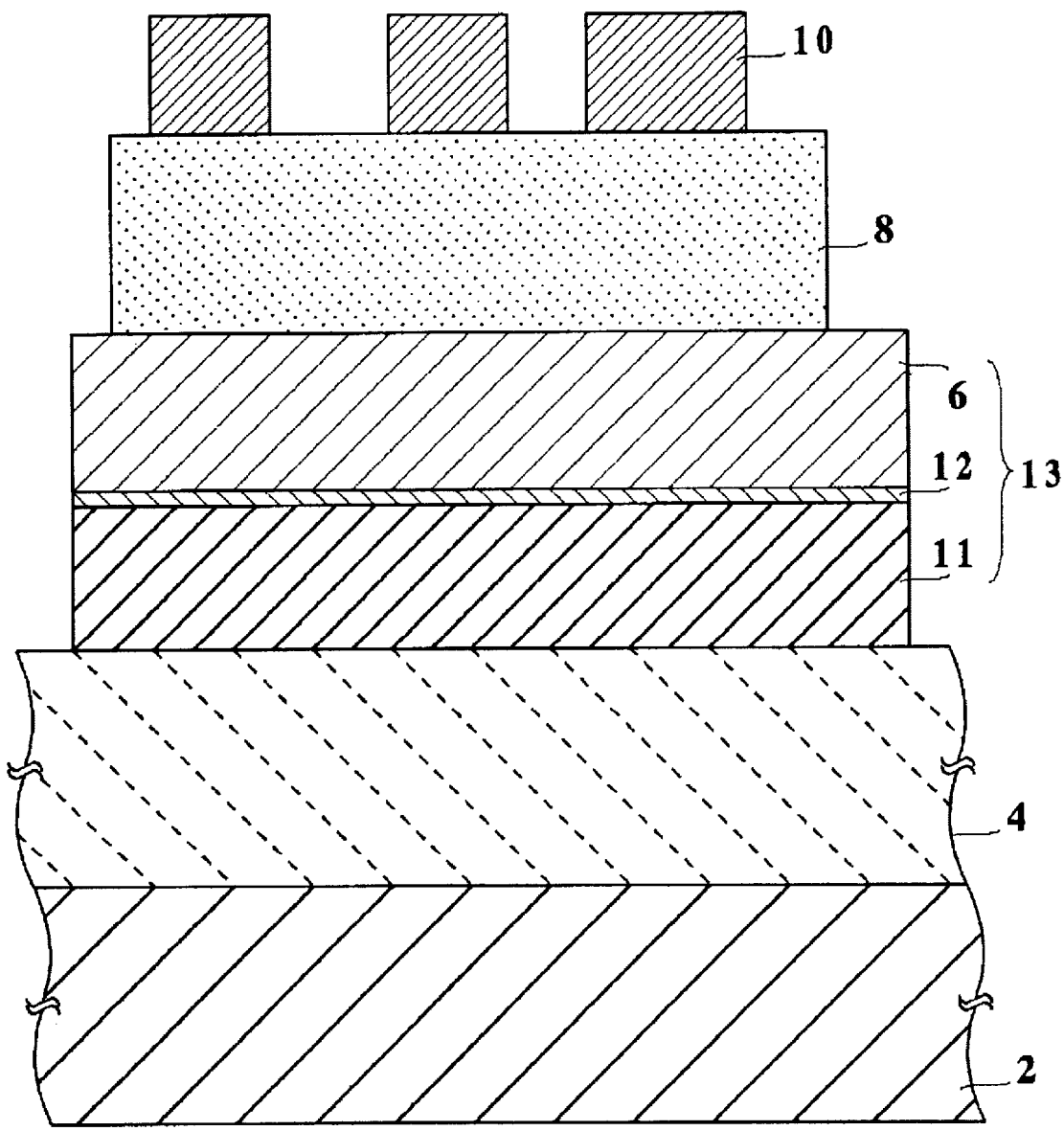
FIG. 3 is a detailed cross sectional view of a ferroelectric capacitor in the present invention.

A preferred embodiment of the present invention will be described below in accordance with the figures. FIG. 3 shows a ferroelectric capacitor as an embodiment of the present invention.

Figure 1:
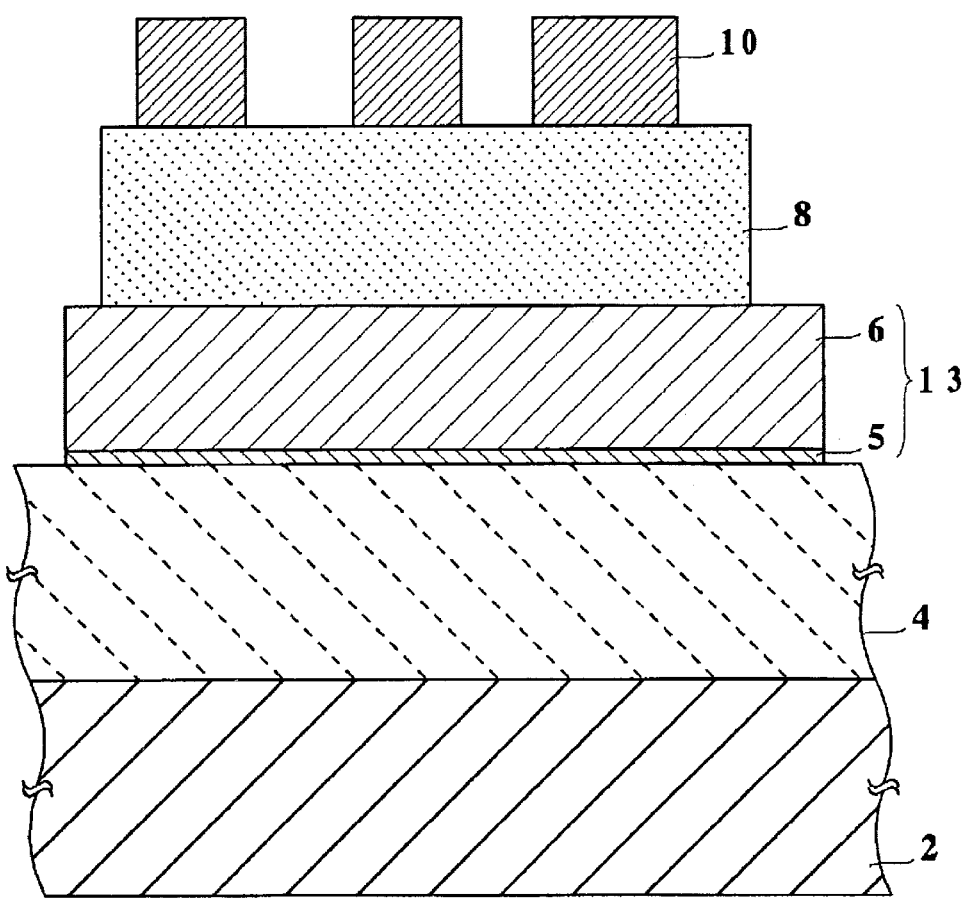
FIG. 1 is a detailed cross sectional view of a ferroelectric capacitor in the prior art.
Figure 2:
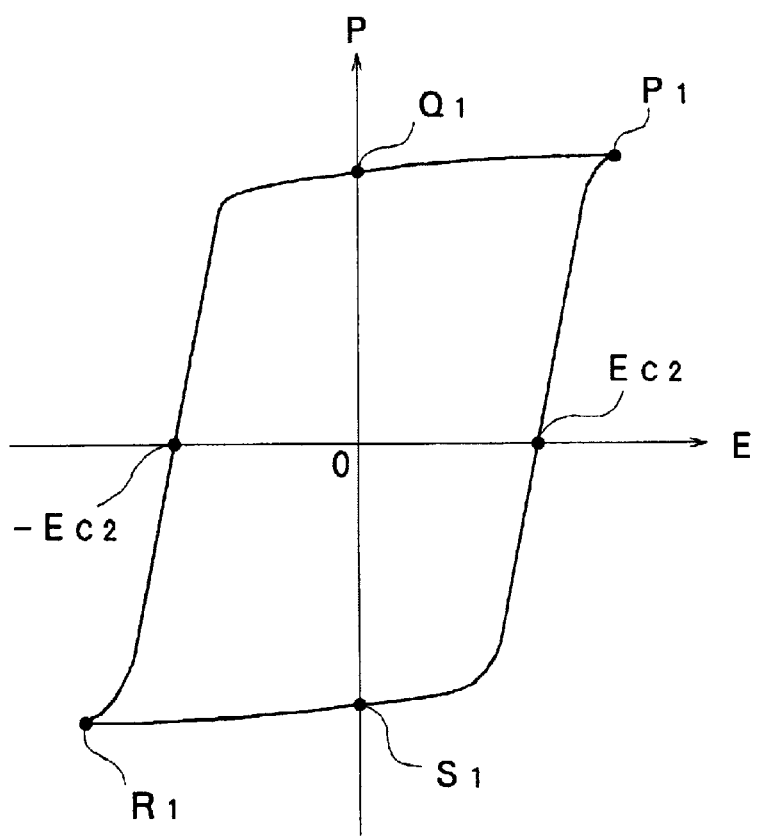
FIG. 2 is a view illustrating an E-P hysteresis loop of PZT thin film.

As shown in FIGS. 1 and 3, the ferroelectric capacitor comprises a silicon substrate 2 on which is formed silicon oxide layer 4, lower electrode 13 as a first electrode, PZT thin film 8 as a crystalline thin film and upper electrode 10 as a second electrode thereon successively. The upper electrode 10 is made of platinum, and the lower electrode 13 consists of tantalum layer 11, titanium layer 12 and platinum layer 6.

Referring now to FIGS. 4A to FIG. 4E, a method for manufacturing the ferroelectric capacitor is disclosed. First, a silicon oxide layer thickness of 600 nm is formed on the surface of the substrate 2 (Si (100)) by thermal oxidation. At this time, a pattern this for "Lift-off" is formed by patterning photo resist 61 on the silicon oxide layer 4, except the portion where the lower electrode 13 is supposed to be formed.

Figure 4A:
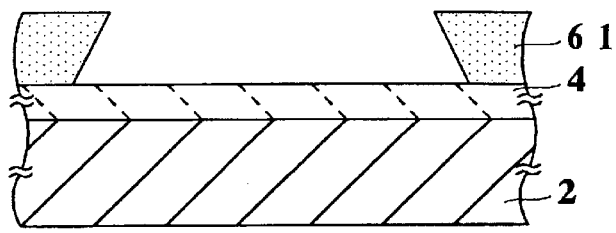
FIG. 4A to FIG. 4E are views illustrating a process for manufacturing a ferroelectric capacitor 1.
Figure 4B:
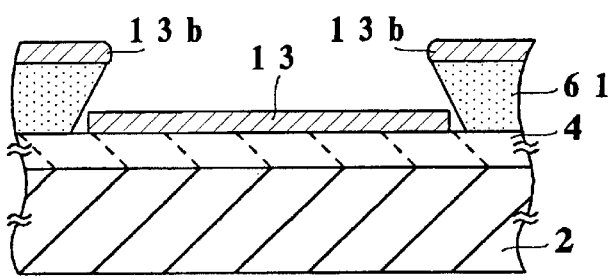

Next, as shown in FIG. 4B, a layer for the lower electrode 13 and 13b is formed on the silicon oxide layer 4 and on the photo resist 61. In this embodiment, RF magnetron sputtering is carried out to below mentioned layers under the following conditions at 20° C. to form the lower electrode 13.

1) Tantalum Layer 11
  : Argon pressure [4 m Torr]
  : High frequency power [300 W/4 inch ∅]
  : Thickness of the layer [50 nm]
2) Titanium Layer 12
  : Argon pressure [10 m Torr]
  : High-frequency power [300 W/4 inch ∅]
  : thickness of the layer [5 nm]
3) Platinum Layer 6
  : Argon pressure [2 m Torr]
  : High-frequency power [500 W/4 inch ∅]
  : thickness of the layer [200 nm]

Figure 4C:
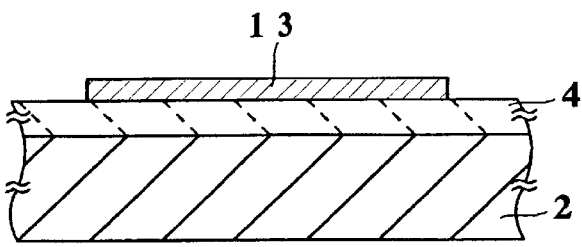

Upon forming the lower electrode 13, the photo resist 61 is removed, so that the layer for the lower electrode 13b is removed together with the photo resist 61, and the lower electrode 13 remains at the predetermined position on silicon oxide layer 4, as shown in FIG. 4C.

Figure 4D:
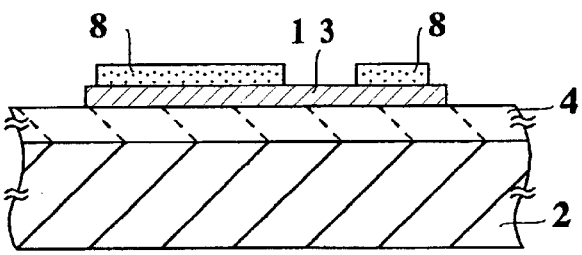
Figure 4E:
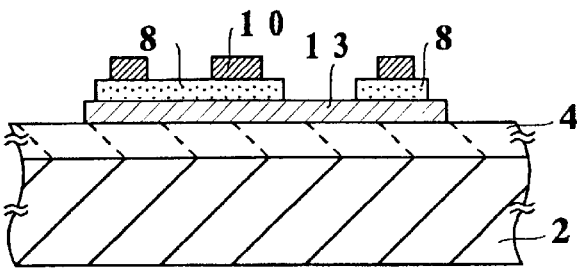

As shown in FIG. 4D, a PZT thin film 8 thickness of 230 nm is formed on the lower electrode 13 by utilizing the Sol-Gel method, as described below. Solution of the PZT is applied onto the lower electrode 13 while rotating the substrate at 3,000 rpm. A dry process is carried out in $N_2$ atmosphere at 150° C. for 15 minutes. A Baking process is carried out in $O_2$ atmosphere at 400° C. for 30 minutes. These processes, such as application of the solution, baking process and dry process, are continued until the layers reach the predetermined thickness. In this embodiment, the predetermined thickness of 230 nm is obtained by repeating these processes 5 times.

After obtaining the predetermined thickness of the layers, thermal treatment is carried out to this structure by utilizing RTA (Rapid Thermal Annealing) device in $O_2$ atmosphere at 700° C. for 1 minute, so that the PZT thin film 8 is formed as a result of crystallization by baking.

As shown in FIG. 4D, the PZT thin film 8 is formed by carrying out chemical etching with photo resist.

After removing the photo resist, upper electrode 10 is formed which consists of a platinum layer by RF magnetron sputtering method with conditions of temperature 20° C., Argon pressure [2 m Torr], high-frequency power [500 W/4 inch ∅] to a thickness of the layer [200 nm], in the same manner as forming the platinum layer of the lower electrode 13.

In this embodiment, PZT is used as a complex compound for a crystalline thin film. However, other ferroelectric compounds such as $PbtiO_3$, barium titanate, bismuth titanate, PLZT, etc. which have ferroelectric characteristics can also be utilized for the crystalline thin film.

In addition, some materials which have high dielectric constants can be employed instead of the ferroelectric compounds mentioned above, for instance $SrTiO_3$, $MgAl_2O_4$, $SrF_2$, $TiO_2$ and others. In the case of using a material which has a high dielectric constant for the crystalline thin film, a higher dielectric constant for the thin film is expected due to the improvement of crystallinity.

Figure 5:
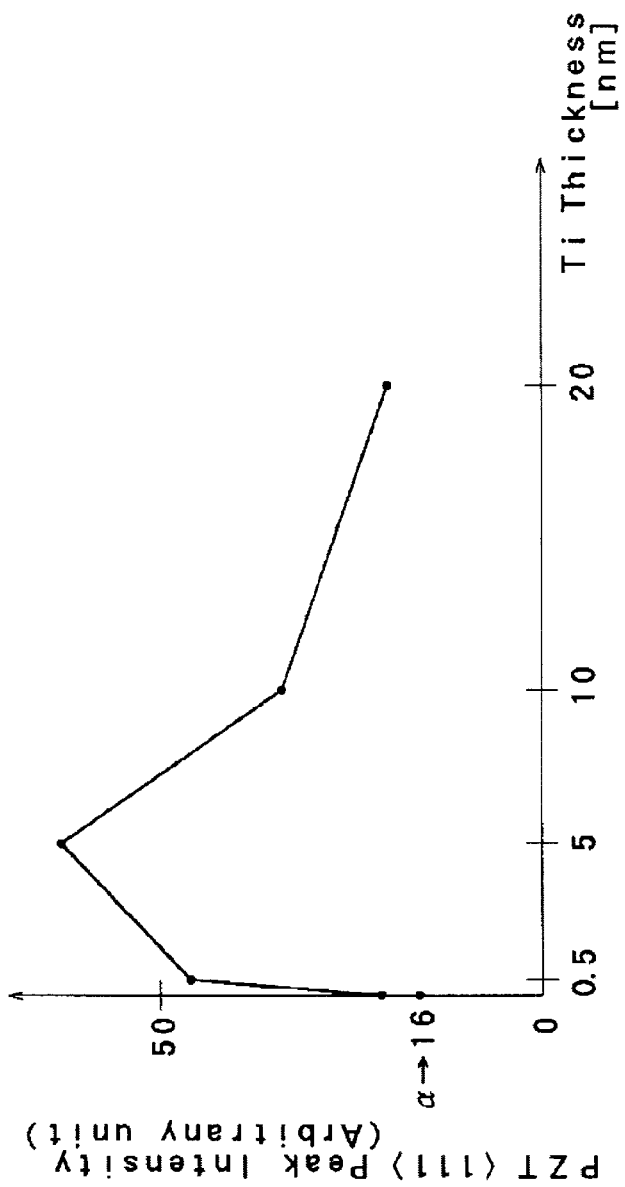
FIG. 5 is a view illustrating the relative strength of X-ray diffraction for PZT <111> when varying the thickness of titanium layer 11.

FIG. 5 shows the relative intensity of X-ray diffraction at PZT <111> on varying the thickness of the titanium layer which is formed between the platinum layer and the tantalum layer from 0 to 20 nm. In FIG. 5, the value of $\alpha$ shows an intensity of X-ray diffraction at PZT surface <111> on in case of-forming the lower electrode in the previous configuration, such as platinum and titanium, without thermal treatment. It is clearly understood that the intensity of X-ray diffraction shown in FIG. 5, by forming the lower electrode, such as forming the titanium layer 12 between the platinum layer, and the tantalum layer has larger intensity of diffraction than forming the lower electrode in the previous configuration, as well as improving its crystallinity. As a result of the above facts, a PZT thin film which has superior crystallinity is thus formed without carrying out thermal treatment when forming the platinum layer 6. Therefore, the platinum layer can be formed by the lift-off method and no damage is caused by the method. Since the configuration has the tantalum layer 11 and the titanium layer 12 between the platinum layer 6 and silicon oxide layer 4, platinum silicide is not formed between an interface of the platinum layer 6 and the silicon oxide layer 4, since the other layers prevent interdiffusion between platinum layer 6 and silicon oxide layer 4.

By utilizing with method of this embodiment, a PZT thin film which has improved crystallinity can be formed. So that a ferroelectric property can be formed which is not easily turn its polarization when the polarity turns frequently as well as accumulating more accumulating electrons can accumulate and be stored therein.

Figure 6:
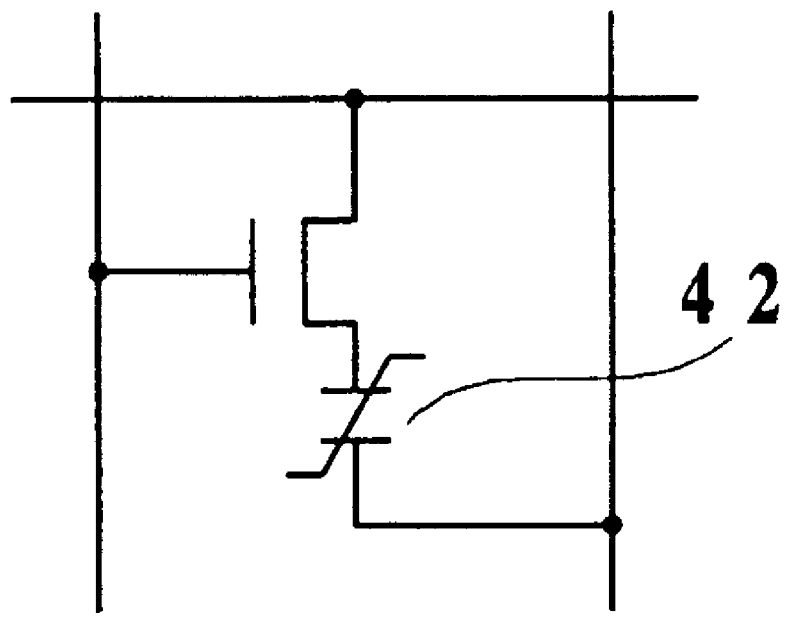
FIG. 6 is a view illustrating an equivalent circuit of a nonvolatile memory utilizing a ferroelectric capacitor 1.

Also a nonvolatile memory can be formed by using the ferroelectric capacitor, by adjusting the circuit as shown in FIG. 6.

In this embodiment, lower electrode 13 consists of a lower layer and an upper layer on the lower layer. The lower layer consists of tantalum layer 11 and the upper layer is consists titanium layer 12 and platinum layer 6. Meanwhile, the layer can be formed with only platinum layer 6. Forming the lower electrode 13 in the above mentioned configuration, crystallinity is improved as shown in FIG. 5.

Also, a device having a crystalline thin film is able to be used in various kinds of sensors such as optical sensor, temperature sensor, humidity sensor and gravity sensor.

Figure 7A:
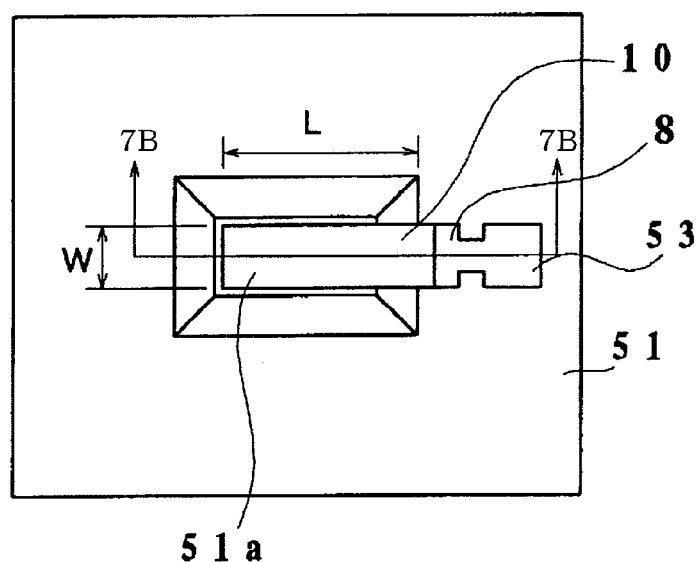
FIG. 7A and FIG. 7B are views illustrating an ultrasonic sensor utilizing complex compound formed by the present invention.
Figure 7B:
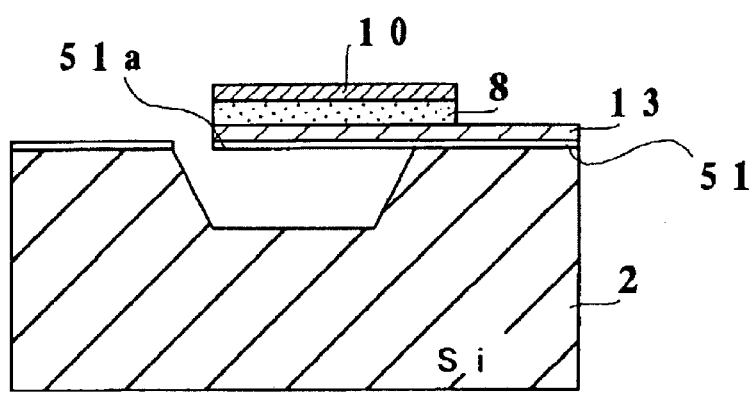

FIGS. 7A and 7B shows an sensor formed in the configuration of the present invention. In the ultrasonic sensor, a part of the silicon oxide layer 51 on the silicon substrate 2 forms an extremely small cantilever 51a. A part of the silicon substrate 2 located underneath the cantilever 51a is selectively etched as shown in FIG. 7B. Also, on the extremely small cantilever 51, the lower electrode 13, the PZT thin film 8 and aluminum electrode 10 are formed. Length L of the extremely small cantilever 51a is 40 to 400 μm and width of the cantilever 51a W is approximately 80 μm.

Once, ultrasound reaches the cantilever, the cantilever 51a causes resonance and polarity of the PZT thin film 8 through piezoelectric effect, so that a voltage is generated between the upper electrode 10 and the lower electrode 13. Therefore, the ultrasound can be detected by utilizing the ultrasonic sensor.

Figure 8:
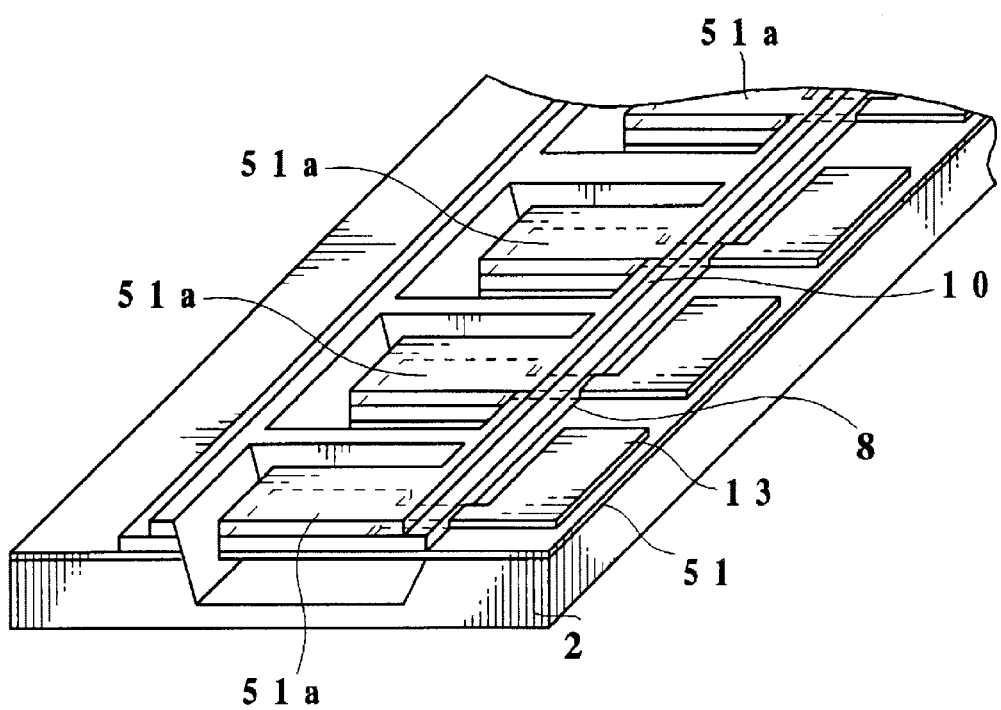
FIG. 8 is a perspective view illustrating infrared sensor utilizing a device having crystalline thin film of complex compound formed by the present invention.

Furthermore, arranging the cantilevers on the silicon substrate 2 in a row, a linear array sensor can be achieved as shown in FIG. 8.

Figure 9A:
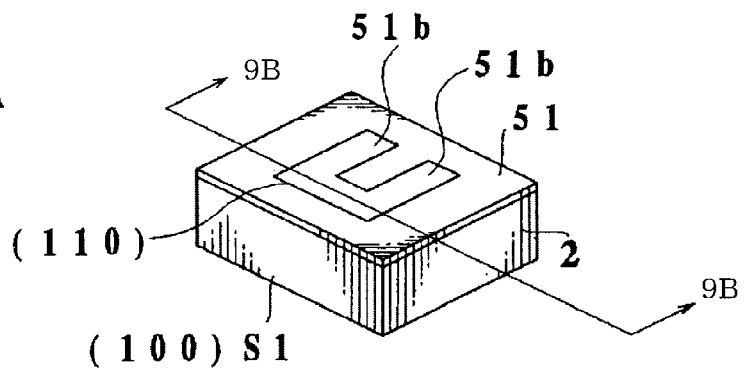
FIG. 9A to FIG. 9D are perspective views an illustrating process for a cantilever formed extremely small.

A method for manufacturing the extremely small cantilever 51a will be described below in accordance with FIGS. 9A to 9D. Initially, thermal oxidation is carried out to silicon substrate 2 and a "U" shaped opening 51b is formed on thermal oxide layer 51 at surface <100> in the direction of the silicon substrate 2, by utilizing photolithography as shown in FIG. 9A. Then, chemical etching is carried out selectively to the thermal oxide layer 51 and the silicon substrate 2 with mixture of ethylenediamine, pyrocatechol and water.

Figure 9B:
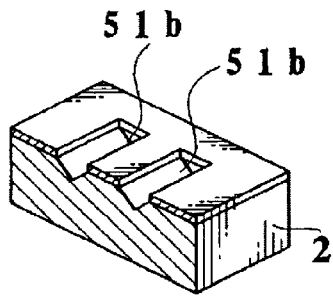
Figure 9C:
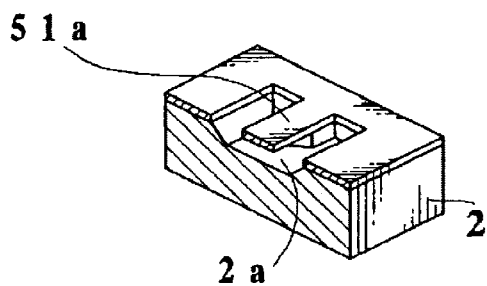
Figure 9D:
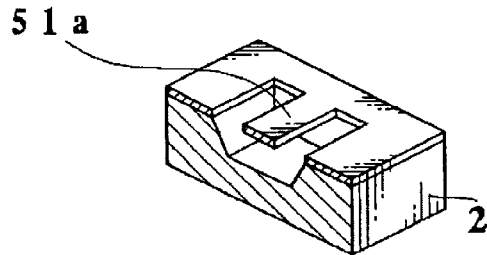

When chemical etching is carried out, etching at the surface <110> surface <111> and the silicon oxide layer proceeds slower than other surfaces of the silicon substrate 2 such as plan surface <110> and cross-sectional surface <100>. Therefore, during the etching process, a "V" shaped opening is formed into the silicon substrate 2 from the opening 51b as shown in FIG. 9B. Note that FIGS. 9B to FIG. 9D show a cross sectional view of line IXB—IXB in FIG. 9A. Further, undercut portion 2a is etched underneath the extremely small cantilever 51a as shown in FIG. 9C. Still further, when etching has been completed, the extremely small cantilever 51a is formed which lacks support from the undercut portion of the substrate 2.

When forming the cantilever 51a, the cantilever can be formed by a silicon layer which has been doped with boron instead of the silicon oxide layer. To utilize the silicon layer for the silicon oxide layer, high density boron must be diffused to the silicon layer except the opening 51b, prior to the process shown in FIG. 9A.

Figure 10:
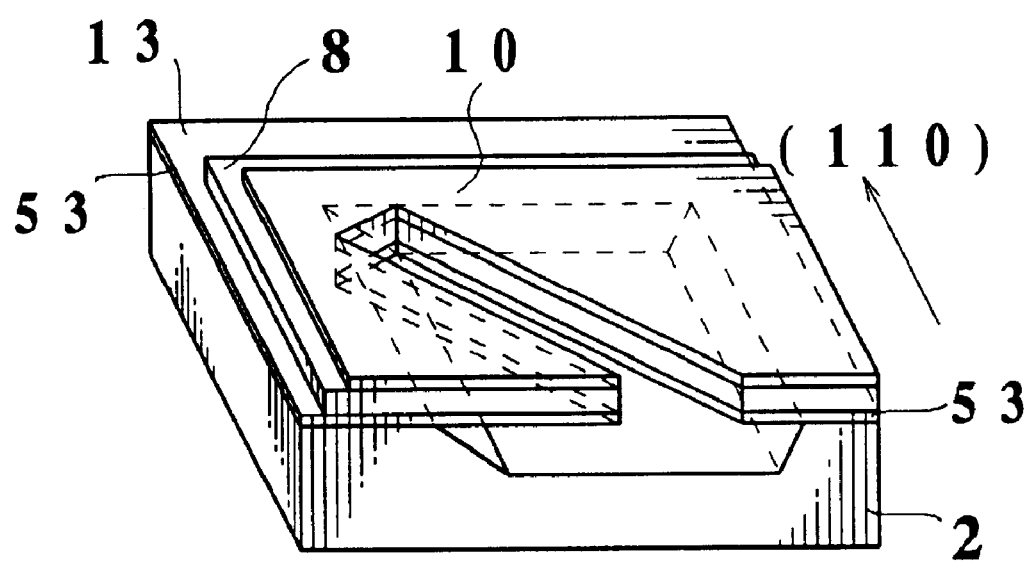
FIG. 10 is a perspective view illustrating a linear array sensor utilizing complex compound formed by the present invention.

FIG. 10 shows an infrared sensor utilizing a device having a crystalline thin film of complex compound formed with the present invention. The infrared sensor is formed through following steps. First, silicon oxide layer with thickness of 500 nm is formed on a silicon substrate 2 by thermal oxidation. Then the silicon oxide layer is removed in a direction of <100> in a groove shape. After the removal, the silicon substrate 2 is removed selectively through the groove. The lower electrode 13, a PZT thin film 8 and transparent electrode 10 which absorbs infrared, are formed on the silicon oxide layer. Once infrared is directed to the sensor, a voltage is caused between the electrodes through turning polarization of the PZT thin film by pyroelectric effect. As a result, infrared can be sensed by the sensor. The method for etching the silicon substrate from the groove which is formed in the direction of <100> can be done in the same manner as the method showing in FIGS. 9A to D.

In the present invention, the lower electrode of a device having crystalline thin film of compound comprises a second layer configured with titanium which is formed between a first layer formed by tantalum and third layer formed by platinum. Therefore, crystallinity of complex compound formed on the third layer can be improved as shown in FIG. 5

Also, in the present invention, a device having crystalline thin film of complex compound comprises second layer configured with titanium which is formed between first layer formed by tantalum and third layer formed by platinum. Therefore, crystallinity of complex compound formed on the third layer can be improved so that a crystalline thin film can be formed which has a high orientation when forming the third layer without thermal treatment. In other words, an electrode for crystalline oxide layer which can be formed high orientation crystalline thin film can be provided without damaging the surface of the silicon substrate 2.

Although the invention has been described in its preferred form with a certain degree of particularity, it is understood that the present disclosure of the preferred form can be changed in the details of its construction and any combination and arrangement of parts may be resorted to without departing from the spirit and the scope of the invention as hereinafter claimed.

What is claimed is:

1. A semiconductor device comprising:
   a) a first electrode having a first layer of tantalum, a second layer of titanium located on the first layers and a third layer containing platinum located on the second layers, said second layer thickness being greater than zero and not greater than 10 nm;
   b) a crystalline thin film of oxide complex compound located on said first electrode; and
   c) a second electrode located on the crystalline thin film.

2. A device in accordance with claim 1; wherein said second layer thickness is about 5 nm.

3. A device in accordance with claim 1, wherein the crystalline thin film is a ferroelectric material.

4. A device in accordance with claim 3, wherein the ferroelectric material is PLZT.

5. A device in accordance with claim 3, wherein the ferroelectric material is $PbTiO_3$.

6. A device in accordance with claim 3, wherein the ferroelectric material is barium titanate.

7. A device in accordance with claim 3, wherein the ferroelectric material is bismuth titanate.

8. A device in accordance with claim 3, wherein the ferroelectric materials is PZT.

9. A device in accordance with claim 1, wherein the crystalline thin film is $SrTiO_3$.

10. A device in accordance with claim 1, wherein the crystalline thin film is $MgAl_2O_4$.

11. A device in accordance with claim 1, wherein the crystalline thin film is $SrF_2$.

12. A device in accordance with claim 1, wherein the crystalline thin film is $TiO_2$.

13. A device in accordance with claim 1, wherein said second layer thickness is 0.5 nm to 5 nm.

* * * * *